United States Patent
Hyodo et al.

(10) Patent No.: US 7,064,088 B2
(45) Date of Patent: Jun. 20, 2006

(54) METHOD FOR FORMING LOW-K HARD FILM

(75) Inventors: Yasuyoshi Hyodo, Tama (JP); Atsuki Fukazawa, Tama (JP); Yoshinori Morisada, Tama (JP); Masashi Yamaguchi, Tama (JP); Nobuo Matsuki, Tama (JP)

(73) Assignee: ASM Japan K.K., Tokyo (JP)

( * ) Notice: Subject to any disclaimer, the term of this patent is extended or adjusted under 35 U.S.C. 154(b) by 128 days.

(21) Appl. No.: 10/412,363

(22) Filed: Apr. 11, 2003

(65) Prior Publication Data

US 2004/0038514 A1 Feb. 26, 2004

Related U.S. Application Data

(63) Continuation-in-part of application No. 10/317,239, filed on Dec. 11, 2002, which is a continuation-in-part of application No. 09/827,616, filed on Apr. 6, 2001, now Pat. No. 6,514,880, which is a continuation-in-part of application No. 09/243,156, filed on Feb. 2, 1999, now abandoned.

(30) Foreign Application Priority Data

Feb. 5, 1998 (JP) .............................. 1998-37929

(51) Int. Cl.
*H01L 21/31* (2006.01)
*H01L 21/469* (2006.01)

(52) U.S. Cl. ...................... 438/787; 438/788; 438/789; 438/790

(58) Field of Classification Search ................ 438/787, 438/788, 789, 790; 427/340, 419.5
See application file for complete search history.

(56) References Cited

U.S. PATENT DOCUMENTS 6,352,945 B1    3/2002   Matsuki et al. .............   438/778

(Continued)

FOREIGN PATENT DOCUMENTS

EP          1 225 194 A2      7/2002

OTHER PUBLICATIONS

U.S. Appl. No. 10/317,239, filed Dec. 11, 2002, Matsuki et al.

(Continued)

*Primary Examiner*—William M. Brewster
(74) *Attorney, Agent, or Firm*—Knobbe, Martens, Olson & Bear, LLP

(57) ABSTRACT

A hard film is formed on an insulation film formed on a semiconductor substrate by vaporizing a silicon-containing hydrocarbon compound to provide a source gas, introducing a reaction gas composed of the source gas and optionally an additive gas such as alcohol to a reaction space of a plasma CVD apparatus, and applying low-frequency RF power and high-frequency RF power. The silicon-containing hydrocarbon compound includes a cyclic Si-containing hydrocarbon compound and/or a linear Si-containing hydrocarbon compound, as a basal structure, with reactive groups for form oligomers using the basal structure. The residence time of the reaction gas in the reaction space is lengthened by reducing the total flow of the reaction gas in such a way as to form a siloxan polymer film with a low dielectric constant.

31 Claims, 1 Drawing Sheet

U.S. PATENT DOCUMENTS

| | | | |
|---|---|---|---|
| 6,383,955 B1 | 5/2002 | Matsuki et al. | 438/790 |
| 6,410,463 B1 | 6/2002 | Matsuki | 438/790 |
| 6,432,846 B1 | 8/2002 | Matsuki | 438/790 |
| 6,436,822 B1 | 8/2002 | Towle | 438/681 |
| 6,455,445 B1 | 9/2002 | Matsuki | 438/789 |
| 6,514,880 B1 | 2/2003 | Matsuki et al. | 438/780 |
| 6,818,570 B1 * | 11/2004 | Tsuji et al. | 438/680 |
| 2003/0100175 A1 * | 5/2003 | Nobutoki et al. | 438/623 |
| 2003/0194880 A1 * | 10/2003 | Singh et al. | 438/778 |
| 2004/0137757 A1 * | 7/2004 | Li et al. | 438/778 |

OTHER PUBLICATIONS

U.S. Appl. No. 10/351,669, filed Jan. 24, 2003, Tsuji et al.
U.S. Appl. No. 10/402,109, filed Mar. 27, 2003, Matsuki et al.

* cited by examiner

METHOD FOR FORMING LOW-K HARD FILM

This is a continuation-in-part of U.S. patent application Ser. No. 10/317,239 filed Dec. 11, 2002, which is a continuation-in-part of U.S. patent application Ser. No. 09/827,616 filed Apr. 6, 2001, now U.S. Pat. No. 6,514,880 which is a continuation-in-part of (i) U.S. patent application Ser. No. 09/243,156 filed Feb. 2, 1999, now abandoned, which claims priority to Japanese patent application No. 37929/1998 filed Feb. 5, 1998, (ii) U.S. application Ser. No. 09/326,847 filed Jun. 7, 1999, now U.S. Pat. No. 6,352,945, (iii) U.S. patent application Ser. No. 09/326,848 filed Jun. 7, 1999, now U.S. Pat. No. 6,383,955, and (iv) U.S. patent application Ser. No. 09/691,376 filed Oct. 18, 2000, now U.S. Pat. No. 6,432,846, all of which are incorporated herein by reference in their entirety. This application claims priority to all of the foregoing under 35 U.S.C. § 119 and § 120.

BACKGROUND OF THE INVENTION

1. Field of the Invention

This invention relates generally to a semiconductor technique and more particularly to a silicone polymer film used as a low-k (low dielectric constant) hard film on a semiconductor substrate, which is formed by using a plasma CVD (chemical vapor deposition) apparatus.

2. Description of the Related Art

Because of the recent rise in requirements for the large-scale integration of semiconductor devices, a multi-layered wiring technique attracts a great deal of attention. In these multi-layered structures, however, capacitance among individual wires hinders high speed operations. In order to reduce the capacitance it is necessary to reduce relative dielectric constant of the insulation film. Thus, various materials having a relatively low relative dielectric constant have been developed for insulation films.

Conventional silicon oxide films $SiO_x$ are produced by a method in which oxygen $O_2$ or nitrogen oxide $N_2O$ is added as an oxidizing agent to a silicon source gas such as $SiH_4$ or $Si(OC_2H_5)_4$ and then processed by heat or plasma energy. Its relative dielectric constant is about 4.0.

Alternatively, a fluorinated amorphous carbon film has been produced from $C_xF_yH_z$ as a source gas by a plasma CVD method. Its relative dielectric constant $\in$ is as low as 2.0–2.4.

Another method to reduce the relative dielectric constant of insulation film has been made by using the good stability of Si—O bond. A silicon-containing organic film is produced from a source gas under low pressure (1 Torr) by the plasma CVD method. The source gas is made from P-TMOS (phenyl trimethoxysilane, formula 1), which is a compound of benzene and silicon, vaporized by a babbling method. The relative dielectric constant $\in$ of this film is as low as 3.1.

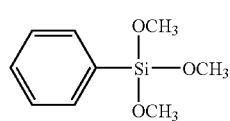

(1)

A further method uses a porous structure made in the film. An insulation film is produced from an inorganic SOG material by a spin-coat method. The relative dielectric constant $\in$ of the film is as low as 2.3.

However, the above noted approaches have various disadvantages as described below.

First, the fluorinated amorphous carbon film has lower thermal stability (370° C.), poor adhesion with silicon-containing materials and also lower mechanical strength. The lower thermal stability leads to damage under high temperatures such as over 400° C. Poor adhesion may cause the film to peel off easily. Further, the lower mechanical strength can jeopardize wiring materials.

Oligomers that are polymerized using P-TMOS molecules do not form a linear structure in the vapor phase, such as a siloxane structure, because the P-TMOS molecule has three O—$CH_3$ bonds. The oligomers having no linear structure cannot form a porous structure on a Si substrate, i.e., the density of the deposited film cannot be reduced. As a result, the relative dielectric constant of the film cannot be reduced to a desired degree.

In this regard, the babbling method means a method wherein vapor of a liquid material, which is obtained by having a carrier gas such as argon gas pass through the material, is introduced into a reaction chamber with the carrier gas. This method generally requires a large amount of a carrier gas in order to cause the source gas to flow. As a result, the source gas cannot stay in the reaction chamber for a sufficient length of time to cause polymerization in a vapor phase.

Further, the SOG insulation film of the spin-coat method has a problem in that the material cannot be applied onto the silicon substrate evenly and another problem in which a cure system after the coating process is costly.

In view of the above, various techniques of forming low-k silica insulation films have been developed.

In order to reduce wiring resistance, copper wiring is widely used in combination with low-k silica insulation films. However, copper tends to migrate or diffuse into the silica insulation films. In order to prevent this problem, a hard film is required between the silica insulation film and copper wiring. Conventionally, SiC or SiN is mainly used as a hard film. However, the dielectric constant of such a hard film is relatively high, and thus when forming the hard film on the silica insulation film, the hard film increases the effective dielectric constant of the integrated layers of the hard film and the silica insulation film, even if the dielectric constant of the insulation film is low. Conventionally, as a source gas, 3MS or 4MS is used, and films having a dielectric constant of less than 4.0 have not been obtained, although a hard film having a low dielectric constant is in demand for reducing the effective dielectric constant at the low-k insulation film.

Therefore, a principal object of this invention is to provide a method for forming an improved hard film which has a low dielectric constant.

Further, properties such as fine structures, barrier effect against copper, and controlling film stress are required for hard films. Another object of this invention is to provide a method for forming a hard film that has a low dielectric constant, fine structures, and appropriate levels of film stress.

A further object of this invention is to provide a method for forming a hard film that has good mechanical strength.

A still further object of this invention is to provide a method for effectively forming a hard film without requiring complicated processes.

SUMMARY OF THE INVENTION

One aspect of this invention may involve a method for forming an insulation film on a semiconductor substrate by using a plasma CVD apparatus including a reaction chamber, which method comprises a step of directly vaporizing a silicon-containing hydrocarbon compound expressed by the general formula $Si_\alpha O_\beta C_x H_y$ ($\alpha, \beta$, x, and y are integers) and then introducing it to the reaction chamber of the plasma CVD apparatus, a step of introducing an additive gas, the flow volume of which is substantially reduced, into the reaction chamber and also a step of forming an insulation film on a semiconductor substrate by plasma polymerization reaction wherein mixed gases made from the vaporized silicon-containing hydrocarbon compound as a source gas and the additive gas are used as a reaction gas. It is a remarkable feature that the reduction of the additive gas flow also results in a substantial reduction of the total flow of the reaction gas. According to the present invention, a silicone polymer film having a micropore porous structure with low dielectric constant can be produced.

The present invention is drawn to a hard film that may be formed on the above insulation film on a semiconductor substrate, that may be in contact with copper wiring, and that may have characteristics described above.

In embodiments of the present invention, by using an organo silicon as a source gas which flows at a decreased flow rate to lengthen the residence time (defined below), plasma polymerization is carried out in a gaseous phase in a reaction chamber to form a hard film having fine structures, and by applying low-frequency RF power, film stress can be controlled, thereby forming a hard film having a low dielectric constant (e.g., 3.5 or lower). Further, by adding an additive gas, hardness of the hard film can be improved.

For purposes of summarizing the invention and the advantages achieved over the prior art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

DETAILED DESCRIPTION OF THE PREFERRED EMBODIMENT

Figure 1:
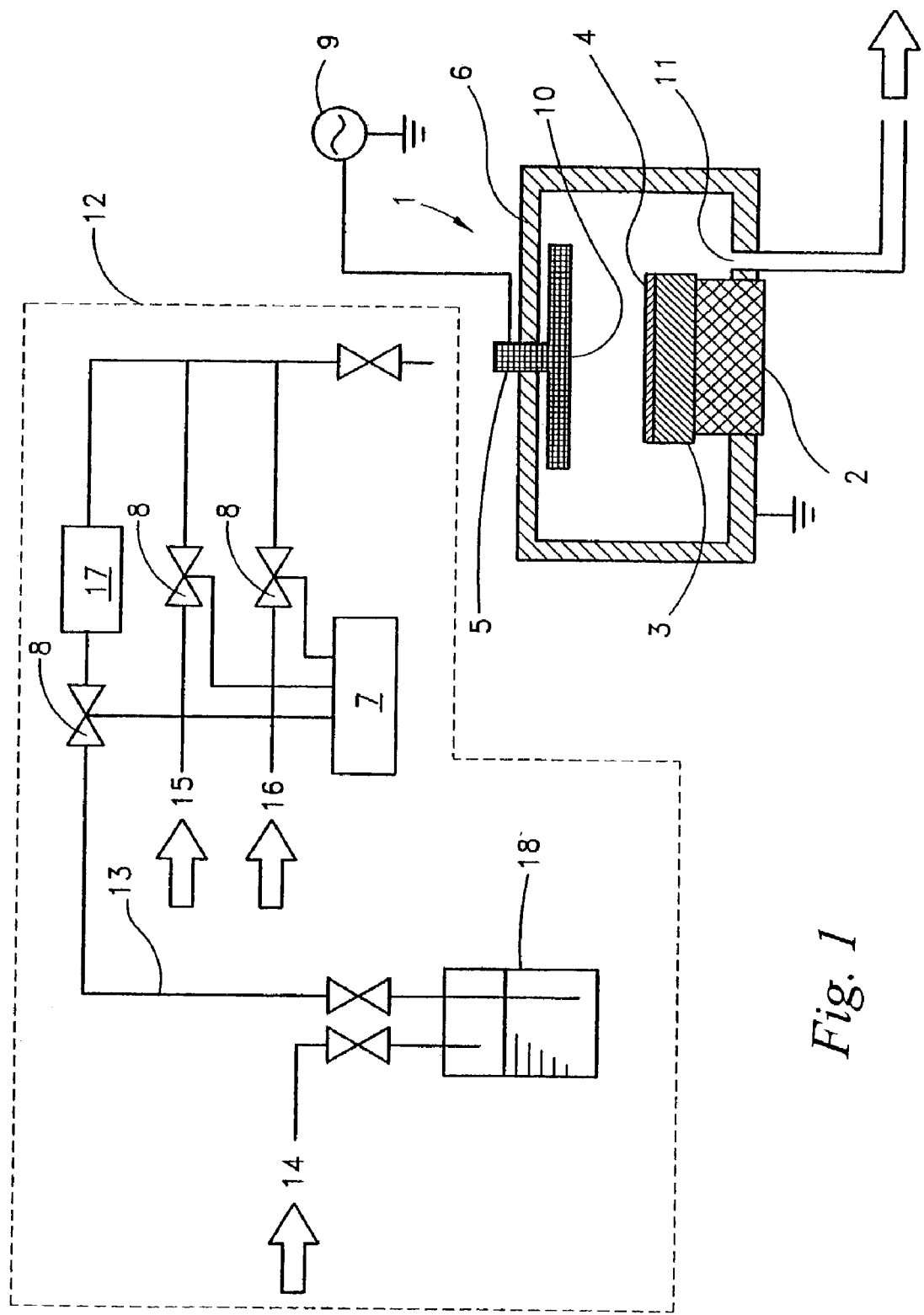
FIG. 1 is a schematic diagram illustrating a plasma CVD apparatus usable forming a hard film according to the present invention.

In an embodiment of the present invention, a hard film may be formed on a low-k insulation film formed by the methods described below. A hard film may be formed using the same source gas as those used for forming a low-k insulation film in an embodiment. In that case, the insulation film and the hard film can continuously be formed using the same equipment, thereby eliminating particle contamination problems and increasing productivity.

Silica insulation films can be formed by a method comprising the steps of: (i) vaporizing a silicon-containing hydrocarbon compound to provide a source gas; (ii) introducing the source gas into a reaction space for plasma CVD processing wherein a semiconductor substrate is placed; (iii) optionally introducing an additive gas selected from the group consisting of an inert gas and an oxidizing gas, said oxidizing gas being used in an amount less than the source gas, said source gas and said additive gas constituting a reaction gas; and (iv) forming an insulation film on the semiconductor substrate by activating plasma polymerization reaction in the reaction space, wherein the plasma polymerization reaction is activated while controlling the flow of the reaction gas to lengthen a residence time, Rt, of the reaction gas in the reaction space, wherein 100 msec$\leq$Rt, $$Rt[s] = 9.42 \times 10^7 (Pr \cdot Ts/Ps \cdot Tr) r_w^2 d/F$$

wherein Pr: reaction space pressure (Pa); Ps: standard atmospheric pressure (Pa); Tr: average temperature of the reaction (K); Ts: standard temperature (K); $r_w$: radius of the silicon substrate (m); d: space between the silicon substrate and the upper electrode (m); F: total flow volume of the reaction gas (sccm).

In the above, the average temperature of the reaction (Tr) is the average temperature of the reaction gas at the substrate, which can be determined by measuring the temperature of the susceptor. The reaction gas comprises a source gas (i.e., material gas or precursor gas) and an additive gas (e.g., a carrier gas, an oxidizing gas, a plasma stabilizing gas, etc.). If no additive gas is used, the source gas itself corresponds to the reaction gas.

In the above, the silicon-containing hydrocarbon compound expressed as the general formula $Si_\alpha O_\beta C_x H_y$ ($\alpha$, $\beta$, x, and y are integers) can be any suitable compounds having structures accomplishing polymerization or oligomerization of the basal structures of the compounds under prolonged residence time conditions. The basal structure includes, but is not limited to, (i) a cyclic Si-containing hydrocarbon compound which may preferably have the formula $Si_n O_n R_{2n-m}$ wherein n is an integer of 3–6, m represents the number of a unsaturated bond between Si and C and is an integer of 1–6 (m$\leq$n), and R is $C_{1-6}$ saturated or unsaturated hydrocarbon attached to Si, and (ii) a linear Si-containing hydrocarbon compound which may preferably have the formula $Si_\alpha O_{\alpha-1} R_{2\alpha-\beta+2} X_\beta$ wherein $\alpha$ and $\beta$ are integers of 1–3, R is $C_{1-6}$ hydrocarbon attached to Si, and X is a reactive group. In an embodiment, the formula is $Si_\alpha O_{\alpha-1} R_{2\alpha-\beta+2} (OC_n H_{2n+1})_\beta$ wherein $\alpha$ is an integer of 1–3, $\beta$ is 0, 1, or 2, n is an integer of 1–3, and R is $C_{1-6}$ hydrocarbon attached to Si.

Reactive groups which form oligomers using the basal structures include, but are not limited to, alkoxy group such as —O—$CH_3$, unsaturated hydrocarbon such as —CH═$CH_3$, amino group such as —$NH_2$, and acid radical such as carboxylic radical —COOH and acetoxyl group —$OCOCH_3$. The reactive group(s) and the basal structure can be included in a single compound or different compounds. That is, as long as the reactive group(s) and the basal structure exist and forms oligomers, compounds can be used singly or in any combination.

For example, the silicon-containing hydrocarbon can be a mixture of a cyclosiloxan compound (precursor 1) and an unsaturated hydrocarbon-containing compound (precursor 2). By oligomerization of precursor 1 using precursor 2, wherein precursor 1 is linked to each other using vinyl groups of precursor 2, a film comprised of oligomers can be formed as described earlier. This film has a low dielectric constant.

In the above, any suitable cyclosiloxan compound can be used, but the cyclosiloxan compound may preferably have the formula $Si_nO_nR_{2n-m}$ wherein n is an integer of 3–6, m represents the number of a unsaturated bond between Si and C and is an integer of 1–6 (m≦n), and R is $C_{1-6}$ saturated or unsaturated hydrocarbon attached to Si. The compound has the structure $-(SiR_{2-m/n}O)_n-$ and may include hexamethylcyclotrisiloxane

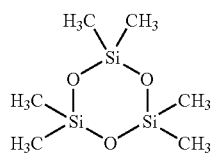

and octamethylcyclotetrasiloxane (OMCTS).

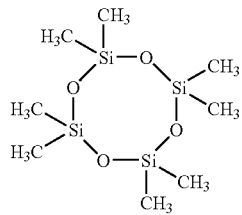

In the above, the unsaturated hydrocarbon-containing compound has at least one vinyl group. Such a unsaturated hydrocarbon may be selected from the group consisting of compounds of the formula $R^1_ySi_xR^2_{2x-y+2}$ and compounds of the formula $C_nH_{2(n-m)+2}$, wherein $R^1$ is $C_{1-6}$ unsaturated hydrocarbon attached to Si, $R^2$ is $C_{1-6}$ saturated hydrocarbon attached to Si, x is an integer of 1–4, y is an integer of 1–2, n is an integer of 1–6, and m represents the number of unsaturated carbon bonds and is an integer of 1–5 (n≧m). The above unsaturated hydrocarbon includes, but are not limited to, unsaturated hydrocarbon-containing organosilicon such as $(CH_3)_2Si(C_2H_3)_2$, $(C_2H_3)_2SiH_2$, $(C_6H_5)_2SiH_2$, $(C_6H_5)SiH_3$, $(C_6H_5)Si(CH_3)_3$, $(C_6H_5)_2Si(CH_3)_2$, and $(C_6H_5)_2Si(OCH_3)_2$, and unsaturated hydrocarbon compounds such as $C_2H_4$, $C_3H_4$, $C_3H_6$, $C_4H_8$, $C_3H_5(CH_3)$, and $C_3H_4(CH_3)_2$. The flow ratio of precursor 1 (sccm) to precursor 2 (sccm) may be in the range of 0.1 to 10 (including 0.5, 1.0, 1.5, 2.0, 2.5, 3.0, 3.5, 5, and a range of any two of the foregoing such as a range of 0.5 to 2).

In the above, oligomerization of the cyclosiloxan compound can be performed with the reactive groups in a vaporous phase, thereby depositing an insulation film comprised of oligomers of the cyclosiloxan compound. According to the above embodiments, the insulation film can have a dielectric constant of 2.7 or less preferably 2.4 or less.

In another embodiment, the aforesaid basal structure and the reactive group(s) are included in a single compound. For example, in the general formula $(Si_nO_nR_{2n-m})X_m$, wherein X is $-O-C_pH_{2p+1}$ wherein p is an integer of 1–4 (preferably 1 or 2) such as $-O-CH_3$, or $-C_zH_{2(z-w)+2}$ wherein z is an integer of 1–4 (preferably 1 or 2), and w represents the number of unsaturated carbon bonds and is an integer of 1–3 (preferably 1) such as $-CH=CH_3$. These compounds include 1,3,5-trimethyl-1,3,5-trimethoxycyclotrisiloxane

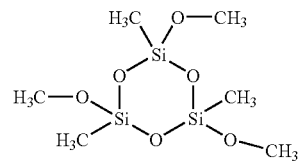

and 1,3,5-trimethyl-1,3,5-trivinyilycyclotrisiloxane.

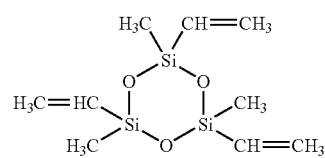

In the above, oligomerization of the cyclosiloxan compound can be performed using their reactive groups in a vaporous phase, thereby depositing an insulation film comprised of oligomers of the cyclosiloxan compound. According to the above embodiments, the insulation film can have a dielectric constant of 2.7 or less preferably 2.4 or less.

In still another embodiment, the silicon-containing hydrocarbon compound may have, as the basal structure, a linear siloxan compound which may preferably have the formula $(Si_\alpha O_{\alpha-1}R_{2\alpha-\beta+2})X_\beta$ or a cyclo-siloxan compound which may preferably have the formula $(Si_nO_nR_{2n-m})X_m$, wherein X is a reactive group including, but not limited to, alkoxy group such as $-O-CH_3$, an amino group such as $-NH_2$, and an acid radical such as carboxylic radical $-COOH$ and acetoxyl group $-OCOCH_3$. These compounds includes $H_2N-Si(CH_3)_2-NH_2$ and $CH_3OCO-Si(CH_3)_2-OCOCH_3$. In the above, if the amino group-containing compound and the acid radical-containing compound are mixed, polymerization can be enhanced by acid-alkali reaction.

In the above, the reactive groups are attached to the basal structure in a single compound, but the reactive groups and the basal structure can be different compounds wherein a reactive group gas is separately added to a basal structure compound to cause oligomization by acid-alkali reaction. For example, the reactive group gas can be any suitable gas including N such as dimethylamine $((CH_3)_2NH)$, N,N-dimethylhydrazine $((CH_3)_2NNH_2)$, ethylazide $(C_2H_5N_3)$, methylamine $(CH_3NH_2)$, and methylhydrazine $(CH_3NHNH_2)$.

A film formed from a precursor having an amino group and/or an acid radical can suitably be used in formation of a wiring structure. When a device uses a low dielectric constant film, a resist is applied on a low dielectric constant film which is then subjected to patterning and etching. Thereafter, the remaining resist is removed and washed out with a chemical solution. In addition to a resist, a sacrificial film may be applied on the low dielectric film, which may also be removed with a chemical solution simultaneously with the resist. The resist and the sacrificial film are organic, and thus their characteristics are similar to those of a low dielectric film (e.g., k<3) which often contains organic materials. Thus, a chemical solution used for removing a resist and/or a sacrificial film may dissolve the low dielectric film. Accordingly, if a strong chemical solution is used in order to increase the removal of the resist and/or sacrificial film, it is difficult to protect the low dielectric film. Many chemical solutions are alkali or acidic. Thus, by rendering the low dielectric film the opposite characteristic, i.e., acidic against an alkali solution and alkali against an acidic solution, decomposition of the low dielectric film can effectively be prevented and protected. This is an example of effective use of a film formed using a precursor having an amino group and/or acid radical as described above.

In the above, oligomerization of the cyclosiloxan compound can be performed with the reactive groups in a vaporous phase, thereby depositing an insulation film comprised of oligomers of the cyclosiloxan compound. According to the above embodiments, the insulation film can have a dielectric constant of 2.7 or less. preferably 2.4 or less.

Additionally, all of the aforesaid compounds and the reactive groups can be used singly or in a combination of at least two of any compounds and/or at least two of any reactive groups.

Compounds which can be mixed include a compound having at least one Si—O bond, two or less O—$C_nH_{2n+1}$ bonds and at least two hydrocarbon radicals bonded with silicon (Si). A preferable silicon-containing hydrocarbon compound has formula:

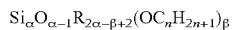

wherein α is an integer of 1–3, β is 0, 1, or 2, n is an integer of 1–3, and R is $C_{1-6}$ hydrocarbon attached to Si.

More specifically, the silicon-containing hydrocarbon compound includes at least one species of the compound expressed by the chemical formula (2) as follows:

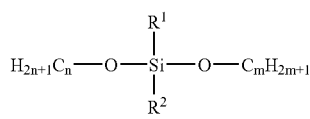

wherein R1 and R2 are one of $CH_3$, $C_2H_3$, $C_2H_5$, $C_3H_7$ and $C_6H_5$, and m and n are any integer.

Except for the species indicated above, the silicon-containing hydrocarbon compound can include at least one species of the compound expressed by the chemical formula (3) as follows:

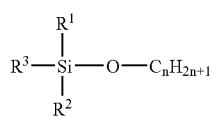

wherein R1, R2 and R3 are one of $CH_3$, $C_2H_3$, $C_2H_5$, $C_3H_7$ and $C_6H_5$, and n is any integer.

Except for those species indicated above, the silicon-containing hydrocarbon compound can include at least one species of the compound expressed by the chemical formula (4) as follows:

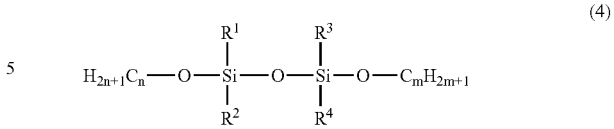

wherein R1, R2, R3 and R4 are one of $CH_3$, $C_2H_3$, $C_2H_5$, $C_3H_7$ and $C_6H_5$, and m and n are any integer.

Further, except for those species indicated above, the silicon-containing hydrocarbon compound can include at least one species of the compound expressed by the chemical formula (5) as follows:

wherein R1, R2, R3, R4, R5 and R6 are one of $CH_3$, $C_2H_3$, $C_2H_5$, $C_3H_7$ and $C_6H_5$, and the additive gases are argon (Ar), Helium (He) and either nitrogen oxide ($N_2O$) or oxygen ($O_2$).

Furthermore, except for those species indicated above, the silicon-containing hydrocarbon compound can include at least one species of the compound expressed by the chemical formula (6) as follows:

wherein R1, R2, R3 and R4 are one of $CH_3$, $C_2H_3$, $C_2H_5$, $C_3H_7$ and $C_6H_5$, and the additive gases are argon (Ar), Helium (He) and either nitrogen oxide ($N_2O$) or oxygen ($O_2$).

Still further, the source gas can include at least one of said silicon-containing hydrocarbon compounds indicated above.

In accordance with another aspect, an insulation film is formed on a substrate and the film is polymerized with plasma energy in a plasma CVD apparatus by using a source gas including a silicon-containing hydrocarbon compound expressed by formula 2.

Additionally, the insulation film is formed on a substrate and the film is polymerized with plasma energy in a plasma CVD apparatus by using a source gas including a silicon-containing hydrocarbon compound expressed by formula 3.

Further, the insulation film is formed on a substrate and the film is polymerized with plasma energy in a plasma CVD apparatus by using a source gas including a silicon-containing hydrocarbon compound expressed by formula 4.

Furthermore, the insulation film is formed on a substrate and the film is polymerized with plasma energy in a plasma CVD apparatus by using a source gas including a silicon-containing hydrocarbon compound expressed by formula 5.

Still further, the insulation film is formed on a substrate and the film is polymerized with plasma energy in a plasma CVD apparatus by using a source gas including a silicon-containing hydrocarbon compound expressed by formula 6.

In accordance with a further aspect, a material for forming an insulation film is supplied in a vapor phase in the vicinity of a substrate and is treated in a plasma CVD apparatus to form the insulation film on the substrate by chemical reaction, and the material is further expressed by formula 2.

Additionally, a material for forming an insulation film is supplied in a vapor phase in the vicinity of a substrate and is treated in a plasma CVD apparatus to form the insulation film on the substrate by chemical reaction, and the material is further expressed by formula 3.

Further, a material for forming an insulation film is supplied in a vapor phase in the vicinity of a substrate and is treated in a plasma CVD apparatus to form the insulation film on the substrate by chemical reaction, and the material is further expressed by formula 4.

Furthermore, a material for forming an insulation film is supplied in a vapor phase with either nitrogen oxide ($N_2O$) or oxygen ($O_2$) as an oxidizing agent in the vicinity of a substrate and is treated in a plasma CVD apparatus to form said insulation film on said substrate by chemical reaction, and this material can be the compound expressed by formula 5.

Still further, a material for forming an insulation film is supplied in a vapor phase with either nitrogen oxide ($N_2O$) or oxygen ($O_2$) as the oxidizing agent in the vicinity of a substrate and is treated in a plasma CVD apparatus to form said insulation film on said substrate by chemical reaction, and this material further can be the compound expressed by formula 6.

The residence time of the reaction gas is determined based on the capacity of the reaction chamber for reaction, the pressure adapted for reaction, and the total flow of the reaction gas. The reaction pressure is normally in the range of 1–10 Torr, preferably 3–7 Torr, so as to maintain stable plasma. This reaction pressure is relatively high in order to lengthen the residence time of the reaction gas. The total flow of the reaction gas is important to reducing the relative dielectric constant of a resulting film. It is not necessary to control the ratio of the source gas to the additive gas. In general, the longer the residence time, the lower the relative dielectric constant becomes. The source gas flow necessary for forming a film depends on the desired deposition rate and the area of a substrate on which a film is formed. For example, in order to form a film on a substrate [r(radius) =100 mm] at a deposition rate of 300 nm/min, at least 50 sccm of the source gas is expected to be included in the reaction gas. That is approximately $1.6 \times 10^2$ sccm per the surface area of the substrate ($m^2$). The total flow can be defined by residence time (Rt). When Rt is defined described below, a preferred range of Rt is 100 msec$\leq$Rt, more preferably 200 msec$\leq$Rt$\leq$5 sec. In a conventional plasma TEOS, Rt is generally in the range of 10–30 msec.

$$Rt[s] = 9.42 \times 10^7 (Pr \cdot Ts/Ps \cdot Tr) r_w^2 d/F$$

wherein:
Pr: reaction chamber pressure (Pa)
Ps: standard atmospheric pressure (Pa)
Tr: average temperature of the reaction (K)
Ts: standard temperature (K)
$r_w$: radius of the silicon substrate (m)
d: space between the silicon substrate and the upper electrode (m)
F: total flow volume of the reaction gas (sccm)

In the above, the residence time means the average period of time in which gas molecules stay in the reaction chamber. The residence time (Rt) can be calculated at Rt=αV/S, wherein V is the capacity of the chamber (cc), S is the volume of the reaction gas (cc/s), and α is a coefficient determined by the shape of the reaction chamber and the positional relationship between the inlet of gas and the outlet of exhaust. The space for reaction in the reaction chamber is defined by the surface of the substrate ($\pi r^2$) and the space between the upper electrode and the lower electrode. Considering the gas flow through the space for reaction, α can be estimated as ½. In the above formula, α is ½.

In this method, the source gas is, in short, a silicon-containing hydrocarbon compound including at least one Si—O bond, at most two O—$C_nH_{2n+1}$ bonds and at least two hydrocarbon radicals bonded to the silicon (Si). Also, this source gas is vaporized by a direct vaporization method. The method results in an insulation film having a low relative dielectric constant, high thermal stability and high humidity-resistance.

More specifically, the source gas vaporized by the direct vaporization method can stay in the plasma for a sufficient length of time. As a result, a linear polymer can be formed so that a linear polymer having the basic structure (formula 7), wherein the "n" is 2 or a greater value, forms in a vapor phase. The polymer is then deposited on the semiconductor substrate and forms an insulation film having a micropore porous structure.

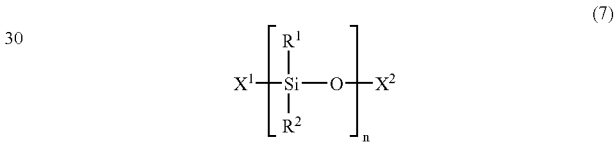

(7)

wherein X1 and X2 are $O_nC_mH_p$ wherein n is 0 or 1, m and p are integers including zero.

The insulation film has a relatively high stability because its fundamental structure has the Si—O bond having high bonding energy therebetween. Also, its relative dielectric constant is low because it has a micropore porous structure. Further, the fundamental structure (—SiO—)$_n$ has, on both sides, dangling bonds ending with a hydrocarbon radical possessing hydrophobicity, and this property renders the humidity-resistance. Furthermore, the bond of a hydrocarbon radical and silicon is generally stable. For instance, both the bond with a methyl radical, i.e., Si—$CH_3$, and bond with benzene, i.e., Si—$C_6H_5$, have a dissociation temperature of 500° C. or higher. Since above semiconductor production requires thermal stability to temperatures above 450° C., that property of the film is advantageous for production of semiconductors.

Further aspects, features and advantages will become apparent from the detailed description of the preferred examples which follows.

FIG. 1 diagrammatically shows a plasma CVD apparatus usable in this invention. This apparatus comprises a reaction gas-supplying device 12 and a plasma CVD device 1. The reaction gas-supplying device 12 comprises plural lines 13, control valves 8 disposed in the lines 13, and gas inlet ports 14, 15 and 16. A flow controller 7 is connected to the individual control valves 8 for controlling a flow of a source gas of a predetermined volume. A container accommodating liquid reacting material 18 is connected to a vaporizer 17 that directly vaporizes liquid. The plasma CVD device 1 includes a reaction chamber 6, a gas inlet port 5, a susceptor 3 and a heater 2. A circular gas diffusing plate 10 is disposed immediately under the gas inlet port. The gas diffusing plate 10 has a number of fine openings at its bottom face and can inject reaction gas to the semiconductor substrate 4 therefrom. There is an exhaust port 11 at the bottom of the reaction chamber 6. This exhaust port 11 is connected to an outer vacuum pump (not shown) so that the inside of the reaction chamber 6 can be evacuated. The susceptor 3 is placed in parallel with and facing the gas diffusing plate 10. The susceptor 3 holds a semiconductor substrate 4 thereon and heats it with the heater 2. The gas inlet port 5 is insulated from the reaction chamber 6 and connected to an outer high frequency power supply 9. Alternatively, the susceptor 3 can be connected to the power supply 9. Thus, the gas diffusing plate 10 and the susceptor 3 act as a high frequency electrode and generate a plasma reacting field in proximity to the surface of the semiconductor substrate 4.

A method for forming an insulation film on a semiconductor substrate by using the plasma CVD apparatus comprises a step of directly vaporizing silicon-containing hydrocarbon compounds expressed by the general formula $Si_\alpha O_\beta C_x H_y$ ($\alpha$, $\beta$, x, and y are integers) and then introducing it to the reaction chamber 6 of the plasma CVD device 1, a step of introducing an additive gas, whose flow is substantially reduced, into the reaction chamber 6 and also a step of forming an insulation film on a semiconductor substrate by plasma polymerization reaction wherein mixed gases, made from the silicon-containing hydrocarbon compound as a source gas and the additive gas, are used as a reaction gas. It is a remarkable feature that the reduction of the additive gas flow also renders a substantial reduction of the total flow of the reaction gas. This feature will be described in more detail later.

The additive gases used in this embodiment, more specifically, are argon gas and helium gas. Argon is principally used for stabilizing plasma, while helium is used for improving uniformity of the plasma and also uniformity of thickness of the insulation film.

In the method described above, the first step of direct vaporization is a method wherein a liquid material, the flow of which is controlled, is instantaneously vaporized at a vaporizer that is preheated. This direct vaporization method requires no carrier gas such as argon to obtain a designated amount of the source gas. This differs greatly with the babbling method. Accordingly, a large amount of argon gas or helium gas is no longer necessary and this reduces the total gas flow of the reaction gas and then lengthens the time in which the source gas stays in the plasma. As a result, sufficient polymerizing reactions occur in the vapor so that a linear polymer can be formed and a film having a micropore porous structure can be obtained.

In FIG. 1, inert gas supplied through the gas inlet port 14 pushes out the liquid reacting material 18, which is the silicon-containing hydrocarbon compound, to the control valve 8 through the line 13. The control valve 8 controls the flow of the liquid reacting material 18 with the flow controller 7 so that it does not exceed a predetermined volume. The reduced silicon-containing hydrocarbon compound 18 goes to the vaporizer 17 to be vaporized by the direct vaporization method described above. Argon and helium are supplied through the inlet ports 15 and 16, respectively, and the valve 8 controls the flow volume of these gases. The mixture of the source gas and the additive gases, which is a reaction gas, is then supplied to the inlet port 5 of the plasma CVD device 1. The space between the gas diffusing plate 10 and the semiconductor substrate 4, both located inside of the reaction chamber 6 which is already evacuated, is charged with high frequency RF voltages, which are preferably 13.4 MHz and 430 kHz, and the space serves as a plasma field. The susceptor 3 continuously heats the semiconductor substrate 4 with the heater 2 and maintains the substrate 4 at a predetermined temperature that is desirably 350–450° C. The reaction gas supplied through the fine openings of the gas diffusing plate 10 remains in the plasma field in proximity to the surface of the semiconductor substrate 4 for a predetermined time.

If the residence time is short, a linear polymer cannot be deposited sufficiently so that the film deposited on the substrate does not form a micropore porous structure. Since the residence time is inversely proportional to the flow volume of the reaction gas, a reduction of the flow volume of the reaction gas can lengthen its residence time.

Extremely reducing the total volume of the reaction gas is effected by reducing the flow volume of the additive gas. As a result, the residence time of the reaction gas can be lengthened so that a linear polymer is deposited sufficiently and subsequently an insulation film having a micropore porous structure can be formed.

In order to adjust the reaction in the vapor phase, it is effective to add a small amount of an inert gas, an oxidizing agent, or a reducing agent to the reaction chamber. Helium (He) and Argon (Ar) are inert gases and have different first ionization energies of 24.56 eV and 15.76 eV, respectively. Thus, by adding either He or Ar singly or both in combination in predetermined amounts, the reaction of the source gas in the vapor phase can be controlled. Molecules of the reaction gas undergo polymerization in the vapor phase, thereby forming oligomers. The oligomers are expected to have a O:Si ratio of 1:1. However, when the oligomers form a film on the substrate, the oligomers undergo further polymerization, resulting in a higher oxygen ratio. The ratio varies depending on the relative dielectric constant or other characteristics of a film formed on the substrate.

The use of an oxidizing agent or a reducing agent is determined depending on the target relative dielectric constant (3.30 or less, preferably 3.10 or less, more preferably 2.80 or less) of a silicone polymer film and other characteristics such as stability of dielectric constant and thermal stability. The O:Si ratio in the source gas is also considered to select an oxidizing agent or a reducing agent, as described above. Preferably, if the ratio is lower than 3:2, an oxidizing agent is used, whereas if the ratio is higher than 3:2, a reducing agent is used. Further, an inert gas such as Ar and He is for controlling plasma reaction, but is not indispensable to form a silicone polymer film. The flow of source gas and the flow of additive gas can also vary depending on the plasma CVD apparatus. The appropriate flow can be determined by correlating the relative dielectric constant of the silicone polymer film with the residence time of the reaction gas (composed of the source gas and the additive gas). The longer the residence time, the lower the dielectric constant becomes. A reduction rate of dielectric constant per lengthened residence time is changeable, and after a certain residence time, the reduction rate of dielectric constant significantly increases, i.e., the dielectric constant sharply drops after a certain residence time of the reaction gas. After this dielectric constant dropping range, the reduction of dielectric constant slows down. This is very interesting. In the present invention, by lengthening residence time until reaching the dielectric constant dropping range based on a predetermined correlation between the dielectric constant of the film and the residence time of the reaction gas, it is possible to reduce the relative dielectric constant of the silicone polymer film significantly.

After the insulation film is formed on a semiconductor substrate, a hard film is formed according to the present invention.

In an embodiment, the hard film may be form by a method comprising the steps of: (i) vaporizing a silicon-containing hydrocarbon compound to provide a source gas, said silicon-containing hydrocarbon compound comprising a cyclosiloxan compound and/or a linear siloxan compound, as a basal structure, with reactive groups for forming oligomers using the basal structure; (ii) introducing the source gas into a reaction space for plasma CVD processing wherein a semiconductor substrate on which an insulation film is formed is placed; and (iii) forming a hard film on the insulation film by activating plasma polymerization reaction using a combination of low-frequency RF power and high-frequency RF power in the reaction space, wherein the plasma polymerization reaction is activated while controlling the flow of the reaction gas to lengthen a residence time, Rt (defined above), of the reaction gas in the reaction space, wherein 100 msec$\leq$Rt (including 110, 120, 130, 140, 150, 160, 170, 180, 190, 200, and a range including any of the forgoing).

According to the above embodiment, a hard film having fine structures can be obtained. By applying low-frequency RF power, film stress of the hard film can be controlled. By overlaying low-frequency RF power and high-frequency RF power, film stress of a hard film can be shifted on a compressive side, and for example, a stress of +50 MPa can be reduced to −200 MPa. The low-frequency RF power may be 1%–50% of the high-frequency RF power (including 5%, 10%, 20%, 30%, 40%, 50%, and a range including any of the forgoing). The low-frequency RF power may have a frequency of 2 MHz or less (including 1 MHz, 800 kHz, 600 kHz, 400 kHz, 200 kHz, 100 kHz, 50 kHz, and a range including any of the forgoing). High-frequency RF power has a frequency of greater than 2 MHz.

The source gas (silicon-containing hydrocarbon) can be selected from the same group as those used for forming an insulation film as described above. Further, the method may comprise introducing a carrier gas into the reaction space when the source gas is introduced. The carrier gas may be selected from the group consisting of $N_2$, He, Ne, and Ar. The flow of the carrier gas can be determined based on the residence time if the pressure is known because the volume of the reaction chamber is constant. For example, in the residence time equation, if Rt$\geq$100 msec, rw=8 inches, d=24 mm, and Pr=533 Pa, then, F$\leq$545 sccm. Thus, if the reaction gas consists of a source gas and a carrier gas, if the flow rate of the source gas is designated, the flow rate of the carrier gas can be calculated accordingly.

In the above, there may be cases where even if film stress is appropriate, sufficient mechanical strength cannot be accomplished. By further introducing an additive gas selected from the group consisting of an oxidizing gas (such as $O_2$ and $CO_2$) and a gas of $C_xH_yO_z$ wherein x=0–3, y=2–15, and z=0–7, into the reaction space when the source gas is introduced, hardness of the hard film can be improved while optimizing film stress of a hard film. The flow rate of additive gas may be 0% to about 80% of the total flow (including 10%, 20%, 30%, 40%, 50%, 60%, 70%, and a range including any two of the foregoing). The flow rates of source gas, carrier gas, and additive gas can be determined based on the residence time equation as described above. In an embodiment, the gas of $C_xH_yO_z$ may be selected from the group consisting of $H_2$, $C_{1-6}$ saturated or unsaturated hydrocarbon (e.g., $CH_4$, $C_2H_6$, $C_3H_8$, $C_2H_4$, $C_3H_6$, $C_4H_8$, $C_nH_{2n+1}$ (n=1–5)), $C_{1-6}$ alkanol (e.g., $CH_3CH(OH)CH_2OH$, $CH_3CH(OH)OCH_3$, $CH_3CH(OH)CH_2OCH_3$), and $C_{3-20}$ ether (e.g., $CH_3CH(OH)CH_3$). For example, preferably gases include reactive gases such as ethylene glycol, 1,2-propanediol, isopropyl alcohol (IPA), ethylene, or diethyl ether, which may cross-link oligomers of silicon-containing hydrocarbon. Further, any suitable alcohol, ether, and/or unsaturated hydrocarbon can be used, which include an alcohol selected from the group consisting of $C_{1-6}$ alkanol and $C_{4-12}$ cycloalkanol, and the unsaturated hydrocarbon selected from the group consisting of $C_{1-6}$ unsaturated hydrocarbon, $C_{4-12}$ aromatic hydrocarbon unsaturated compounds, and $C_{4-12}$ alicyclic hydrocarbon unsaturated compounds. In the foregoing, compounds having a higher number of carbon atoms include, but are not limited to: 1,4-cyclohexane diol (b.p. 150° C./20 mm), 1,2,4-trivinylcyclohexane (b.p. 85–88° C./20 mm), 1,4-cyclohexane dimethanol (b.p. 283° C.), and 1,3-cyclopentane diol (80–85° C./0.1 Torr). Further, compounds having multiple reactive groups ('mixed' functionalities, i.e., unsaturated hydrocarbon and alcohol functionalities) can also be used as cross-linkers, which include, but are not limited to: $C_{3-20}$ ether such as ethylene glycol vinyl ether $H_2C=CHOCH_2OH$ (b.p. 143° C.), ethylene glycol divinyl ether $H_2C=CHOCH_2CH_2OCH=CH_2$ (b.p. 125–127° C.), and 1,4-cyclohexane dimethanol divinyl ether (b.p. 126° C./14 mm) $(H_2C=C(OH)-CH_2)_2-(CH_2)_6)$; and $C_{5-12}$ cycloalkanol vinyl compounds such as 1-vinylcyclohexanol (b.p. 74° C./19 mm). Further, as an oxygen-supplying gas, $O_2$, NO, $O_3$, $H_2O$ or $N_2O$ can be included to supply oxygen in the source gas if sufficient oxygen atoms are not present in the silicon-containing hydrocarbon compound.

In another aspect of the present invention, a method may comprise the steps of: (I) forming an insulation film on a semiconductor substrate placed in a reaction space by plasma polymerization using a silicon-containing hydrocarbon compound; (II) vaporizing a silicon-containing hydrocarbon compound to provide a source gas, said silicon-containing hydrocarbon compound comprising a cyclic Si-containing hydrocarbon compound and/or a linear Si-containing hydrocarbon compound, as a basal structure, with reactive groups for forming oligomers using the basal structure; (III) introducing the source gas into the reaction space; and (IV) forming a hard film on the insulation film by activating plasma polymerization reaction using a combination of low-frequency RF power and high-frequency RF power in the reaction space, wherein the plasma polymerization reaction is activated while controlling the flow of the reaction gas to lengthen a residence time, Rt (defined above), of the reaction gas in the reaction space, wherein 100 msec$\leq$Rt.

In the above, the silicon-containing hydrocarbon used for forming the hard film and the silicon-containing hydrocarbon used for forming the insulation film may have the same chemical formula. By doing this, particle contamination problems can be effectively eliminated.

Further, when the formation of the insulation film and the formation of the hard film are conducted continuously in the reaction space, productivity can be significantly improved.

The formation of a hard film can be conducted in accordance with the processes of forming an insulation film, including conditions such as concentration of gases, flow rates, pressure, and temperature.

According to embodiments of the present invention, a hard film may have a dielectric constant of about less than 4, a stress of about 0 to about 300 MPa.

EXAMPLE

Experiments were conducted as described below. The results are indicated in tables below. In these experiments, an ordinary plasma CVD device (EAGLE®-10, ASM Japan K.K.) was used as an experimental device wherein:
- $r_w$ (radius of the silicon substrate): 0.1 m
- d (space between the silicon substrate and the upper electrode): 0.024 m
- Ps (standard atmospheric pressure): $1.01 \times 10^5$ Pa
- Ts (standard temperature): 273 K

Example 1

The conditions for forming a hard film are as follows:
- DMDMOS (dimethyl dimethoxysilane): 160 sccm
- IPA (isopropyl alcohol): 200 sccm
- He: 50 sccm
- Pr (reaction chamber pressure): 500 Pa
- RF power supply (HF: 13.4 MHz): 1600 W
- RF power supply (LF: 400 kHz): 200 W
- Tr (average temperature of the reaction): 673 K
- F (total flow volume of the reaction gas): 410 sccm
- Rt (residence time; $Rt[s]=9.42 \times 10^7 (Pr \cdot Ts/Ps \cdot Tr) r_w^2 d/F$): 119 ms The hard film was formed on an insulation film which was formed using the same Si-containing hydrocarbon compound under the deposition conditions described in U.S. patent application Ser. No. 10/317,239, filed Dec. 11, 2002, the disclosure of which is incorporated by reference. The characteristics of the hard film obtained are as follows, and as can be seen, all of the dielectric constant, stress, Modulus, and hardness of the hard film are satisfactory:
- k (dielectric constant): 3.5
- Stress: −160 MPa
- Modulus: 35 GPa
- Hardness: 4.1 GPa

Example 2

The conditions for forming a hard film are as follows:
- DMDMOS (dimethyl dimethoxysilane): 160 sccm
- IPA (isopropyl alcohol): 0 sccm
- He: 150 sccm
- Pr (reaction chamber pressure): 533 Pa
- RF power supply (HF: 13.4 MHz): 1400 W
- RF power supply (LF: 400 kHz): 300 W
- Tr (average temperature of the reaction): 673 K
- F (total flow volume of the reaction gas): 310 sccm
- Rt (residence time; $Rt[s]=9.42 \times 10^7 (Pr \cdot Ts/Ps \cdot Tr) r_w^2 d/F$): 168 ms The hard film was formed on an insulation film which was formed using the same Si-containing hydrocarbon compound under the conditions described in Example 1. The characteristics of the hard film obtained are as follows, and as can be seen, all of the dielectric constant, stress, Modulus, and hardness of the hard film are satisfactory:
- k (dielectric constant): 3.4
- Stress: −180 MPa
- Modulus: 25 GPa
- Hardness: 3.1 GPa

Example 3

The conditions for forming a hard film are as follows:
- OMCTC (octamethylcyclotetrasiloxane): 160 sccm
- DVDVS ($(CH_3)_2Si(C_2H_3)_2$): 80 sccm
- He: 100 sccm
- Pr (reaction chamber pressure): 467 Pa
- RF power supply (HF: 13.4 MHz): 1500 W
- RF power supply (LF: 400 kHz): 200 W
- Tr (average temperature of the reaction): 673 K
- F (total flow volume of the reaction gas): 340 sccm
- Rt (residence time; $Rt[s]=9.42 \times 10^7 (Pr \cdot Ts/Ps \cdot Tr) r_w^2 d/F$): 120 ms The hard film was formed on an insulation film which was formed using the same Si-containing hydrocarbon compounds under the conditions described in Example 1. The characteristics of the hard film obtained are as follows, and as can be seen, all of the dielectric constant, stress, Modulus, and hardness of the hard film are satisfactory:
- k (dielectric constant): 3.5
- Stress: −190 MPa
- Modulus: 27 GPa
- Hardness: 3.3 GPa

Example 4

The conditions for forming a hard film are as follows:
- TMTVS ($[CH_2=CH(CH_3)SiO]_3$): 140 sccm
- He: 100 sccm
- Pr (reaction chamber pressure): 360 Pa
- RF power supply (HF: 13.4 MHz): 200 W
- RF power supply (LF: 400 kHz): 50 W
- Tr (average temperature of the reaction): 673 K
- F (total flow volume of the reaction gas): 340 sccm
- Rt (residence time; $Rt[s]=9.42 \times 10^7 (Pr \cdot Ts/Ps \cdot Tr) r_w^2 d/F$): 149 ms The hard film was formed on an insulation film which was formed using the same Si-containing hydrocarbon compound under the conditions described in Example 1. The characteristics of the hard film obtained are as follows, and as can be seen, all of the dielectric constant, stress, Modulus, and hardness of the hard film are satisfactory:
- k (dielectric constant): 3.3
- Stress: −140 MPa
- Modulus: 23 GPa
- Hardness: 2.8 GPa Although this invention has been described in terms of certain examples, other examples apparent to those of ordinary skill in the art are within the scope of this invention. Accordingly, the scope of the invention is intended to be defined only by the claims that follow. The present invention includes various embodiments and are not limited to the above examples. The present invention particularly includes, but are not limited to, the following embodiments, and any combination of the forgoing embodiments and the following embodiments can readily be accomplished:

1) A method is for forming an insulation film on a semiconductor substrate by plasma reaction and comprises the steps of: (i) vaporizing a silicon-containing hydrocarbon compound to provide a source gas; (ii) introducing the source gas into a reaction space for plasma CVD processing wherein a semiconductor substrate is placed; (iii) optionally introducing an additive gas selected from the group consisting of an inert gas and an oxidizing gas, said oxidizing gas being used in an amount less than the source gas, said source gas and said additive gas constituting a reaction gas; and (iv) forming an insulation film on the semiconductor substrate by activating plasma polymerization reaction in the reaction space, wherein the plasma polymerization reaction is activated while controlling the flow of the reaction gas to lengthen a residence time, Rt, of the reaction gas in the reaction space, wherein 100 msec≦Rt, $$Rt[s]=9.42\times10^{7}(Pr\cdot Ts/Ps\cdot Tr)r_{w}^{2}d/F$$

wherein Pr: reaction space pressure (Pa); Ps: standard atmospheric pressure (Pa); Tr: average temperature of the reaction (K); Ts: standard temperature (K); $r_w$: radius of the silicon substrate (m); d: space between the silicon substrate and the upper electrode (m); F: total flow volume of the reaction gas (sccm).

In the above, the reaction space should not be limited to a physically defined single section, but should include any suitable space for plasma reaction. That is, as one of ordinary skill in the art readily understands, the space is a functionally defined reaction space. The space may be comprised of a physically defined single section such as the interior of a reactor, or physically defined multiple sections communicated with each other for plasma reaction, such as the interior of a remote plasma chamber and the interior of a reactor. Further, the space includes the interior of piping connecting multiple sections through which a reaction gas passes. The interior of the reactor includes only the space used for plasma reaction. Thus, if only a part of the reactor interior is used for plasma reaction where the reactor is composed of multiple sections, only the part used for plasma reaction constitutes a reaction space. Further, the plasma reaction includes a preliminary reaction for plasma polymerization. For example, upstream of a reactor, heating a reaction gas (e.g., 150° C. to 500° C., preferably 200° C. to 300° C., in a pre-heater chamber), exciting a reaction gas (e.g., in a remote plasma chamber), or mixing an excited additive gas and a source gas (e.g., in a pre-heater chamber) is included in a preliminary reaction.

2) In the method according to Item 1, the source gas and the additive gas are separately introduced into the reaction space. The additive gas and the source gas can be mixed upstream of a reactor and introduced into the reactor. However, they can be introduced separately, depending on the configuration of a reactor. As long as the gases are not in a reactive state, regardless of whether the additive gas and the source gas are mixed or separated, the space where the gases are present does not constitute a reaction space. At a point where additive gas and the source gas are in contact in a reactive state, the reaction space begins. The reactive state includes states where the reaction gas is heated or excited, or the excited additive gas and the source gas are mixed, for example.

3) In the method according to Item 1 or 2, the plasma polymerization reaction comprises exciting the reaction gas and depositing the film on the substrate. As described above, the plasma polymerization reaction includes a preliminary reaction such as excitation of the reaction gas.

4) In the method according to any one of Items 1–3, the reaction space comprises a space for exciting the reaction gas and a space for depositing the film. In this embodiment, the reaction gas can be excited in a remote plasma chamber installed upstream of a reactor, and the film is deposited on the substrate in the reactor. The source gas and the additive gas can be introduced into the remote plasma chamber. In this case, the reaction space is composed of the interior of the remote plasma chamber, the interior of the reactor, and the interior of the piping connecting the remote plasma chamber and the reactor. Because of using the interior of the remote plasma chamber, the interior of the reactor can be significantly reduced, and thus, the distance between the upper electrode and the lower electrode can be reduced. This leads to not only downsizing the reactor, but also uniformly controlling a plasma over the substrate surface. Any suitable remote plasma chamber and any suitable operation conditions can be used in the present invention. For example, usable are the apparatus and the conditions disclosed in U.S. patent applications Ser. No. 09/511,934 filed Feb. 24, 2000 and Ser. No. 09/764,523 filed Jan. 18, 2001, U.S. Pat. No. 5,788,778, and U.S. Pat. No. 5,788,799. The disclosure of each of the above is incorporated herein by reference in its entirety.

5) In the method according to Item 3 or 4, the excitation of the reaction gas comprises exciting the additive gas and contacting the excited additive gas and the source gas. The excitation of the reaction gas can be accomplished in the reactor or upstream of the reactor. As described above, both the source gas and the additive gas can be excited in a remote plasma chamber. Alternatively, the excitation of the reaction gas can be accomplished by exciting the additive gas in a remote plasma chamber and mixing it with the source gas downstream of the remote plasma chamber.

6) In the method according to any one of Items 1–3, the reaction space comprises a space for heating the reaction gas and a space for exciting the reaction gas and depositing the film. In this embodiment, the reaction gas can be heated in a pre-heat chamber installed upstream of a reactor, the reaction gas is excited in the reactor, and film is deposited on the substrate in the reactor. The source gas and the additive gas can be introduced into the pre-heater chamber. In this case, the reaction space is composed of the interior of the pre-heater chamber, the interior of the reactor, and the interior of the piping connecting the pre-heater chamber and the reactor. Because of using the interior of the pre-heater chamber, the interior of the reactor can be significantly reduced, and thus, the distance between the upper electrode and the lower electrode can be reduced. This leads to not only downsizing the reactor, but also uniformly controlling a plasma over the substrate surface. Any suitable remote plasma chamber and any suitable operation conditions can be used in the present invention. For example, usable are the apparatus and the conditions disclosed in the aforesaid references.

7) In the method according to Item 6, the excitation of the reaction gas comprises exciting the additive gas and contacting the excited additive gas and the source gas. In this embodiment, the additive gas can be excited in a remote plasma chamber, and the source gas is heated in a pre-heater chamber where the excited additive gas and the source gas are in contact, and then the reaction gas flows into the reactor for deposition of a film. In this case, deposition of unwanted particles on a surface of the remote plasma chamber, which causes a failure of ignition or firing, can effectively be avoided, because only the additive gas is present in the remote plasma chamber. The source gas is mixed with the excited additive gas downstream of the remote plasma chamber. The reaction space may be composed of the interior from a point where the excited additive gas and the source gas meet to an entrance to the reactor, and the interior of the reactor.

8) In the method according to any one of Items 1–7, the additive gas can be selected from the group consisting of nitrogen, argon, helium, and oxygen, but should not be limited thereto.

9) In the method according to any one of Items 1–8, the plasma polymerization reaction is conducted at a temperature of 350–450° C. However, the suitable temperature varies depending on the type of source gas, and one of ordinary skill in the art could readily select the temperature.

In the present invention, polymerization includes any polymerization of two or more units or monomers, including oligomerization.

10) In the method according to any one of Items 1–9, the formation of the insulation film is conducted while maintaining a gas diffusing plate at a temperature of 150° C. or higher (e.g., 150° C. to 500° C., preferably 200° C. to 300° C.), through which the reaction gas flows into the reaction space, so that the reaction is promoted. In the above, the gas diffusing plate (or showerhead) may be equipped with a temperature control device to control the temperature. Conventionally, the temperature of the showerhead is not positively controlled and is normally 140° C. or lower when the temperature of the reaction space is 350–450° C., for example.

11) In the method according to any one of Items 1–10, the residence time is determined by correlating the dielectric constant with the residence time. This embodiment has been described earlier. The following embodiments also have been described earlier:

12) In the method according to any one of Items 1–11, the flow of the reaction gas is controlled to render the relative dielectric constant of the insulation film lower than 3.10.

13) In the method according to any one of Items 1–12, Rt is no less than 165 msec or 200 msec.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method for forming a hard film on an insulation film formed on a semiconductor substrate by plasma reaction, comprising the steps of:

vaporizing a silicon-containing hydrocarbon compound to provide a source gas, said silicon-containing hydrocarbon compound comprising a cyclic Si-containing hydrocarbon compound and/or a linear Si-containing hydrocarbon compound, as a basal structure, with reactive groups for forming oligomers using the basal structure;

introducing a reaction gas comprising the source gas and a carrier gas into a reaction space for plasma CVD processing wherein a semiconductor substrate on which an insulation film is formed is placed; and forming a hard film on the insulation film by activating plasma polymerization reaction using a combination of low-frequency RF power and high-frequency RF power in the reaction space, wherein the plasma polymerization reaction is activated while controlling the flow of the reaction gas to lengthen a residence time, Rt, of the reaction gas in the reaction space, wherein 100 msec$\leq$Rt, $$Rt[s]=9.42\times10^7(Pr\cdot Ts/Ps\cdot Tr)r_w^2 d/F$$

wherein:
Pr: reaction space pressure (Pa)
Ps: standard atmospheric pressure (Pa)
Tr: average temperature of the reaction (K)
Ts: standard temperature (K)
$r_w$: radius of the silicon substrate (m)
d: space between the silicon substrate and the upper electrode (m)
F: total flow volume of the reaction gas (sccm).

2. The method according to claim 1, wherein said reactive group is selected from the group consisting of alkoxy group, vinyl group, amino group, and acid radical.

3. The method according to claim 1, wherein said silicon-containing hydrocarbon is a mixture of a cyclosiloxan compound and an unsaturated hydrocarbon-containing compound.

4. The method according to claim 3, wherein the cyclosiloxan compound has the formula $Si_nO_nR_{2n-m}$, wherein n is an integer of 3–6, m represents the number of a unsaturated bond between Si and C and is an integer of 1–6 (m$\leq$n), and R is $C_{1-6}$ saturated or unsaturated hydrocarbon attached to Si.

5. The method according to claim 3, wherein the unsaturated hydrocarbon-containing compound has at least one vinyl group.

6. The method according to claim 3, wherein the polymerization is oligomerization of the cyclosiloxan compound, thereby forming an insulation film comprised of oligomers of the cyclosiloxan compound.

7. The method according to claim 2, wherein said silicon-containing hydrocarbon is a cyclosiloxan compound having reactive groups.

8. The method according to claim 7, wherein said reactive group is selected from the group consisting of alkoxy group and vinyl group.

9. The method according to claim 8, wherein said silicon-containing hydrocarbon has the formula $(Si_nO_nR_{2n-m})X_m$, wherein n is an integer of 3–6, m represents the number of a unsaturated bond between Si and C and is an integer of 1–6 (m$\leq$n), R is $C_{1-6}$ saturated or unsaturated hydrocarbon attached to Si, X is —O—$C_pH_{2p+1}$ wherein p is an integer of 1–4 or —$C_zH_{2(z-w)+2}$ wherein z is an integer of 1–4, and w represents the number of unsaturated carbon bonds and is an integer of 1–3.

10. The method according to claim 7, wherein said reactive group is selected from the group consisting of amino group and acid radical.

11. The method according to claim 10, wherein the reactive group is included in a different compound from the silicon-containing hydrocarbon.

12. The method according to claim 10, wherein the reactive group is included in the silicon-containing hydrocarbon.

13. The method according to claim 2, wherein said silicon-containing hydrocarbon compound has the formula $Si_\alpha O_{\alpha-1}R_{2\alpha-\beta+2}X\beta$ wherein $\alpha$ and $\beta$ are integers of 1–3, R is $C_{1-6}$ hydrocarbon attached to Si, and X is a reactive group.

14. The method according to claim 13, wherein said reactive group is selected from the group consisting of amino group and acid radical.

15. The method according to claim 13, wherein said reactive group is alkoxy group.

16. The method according to claim 1, wherein the hard film has a dielectric constant of 3.5 or less.

17. The method according to claim 1, wherein the carrier gas is selected from the group consisting of $N_2$, He, Ne, and Ar.

18. The method according to claim 1, further comprising introducing an additive gas selected from the group consisting of an oxidizing gas and a gas of CxHyOz wherein x=0–3, y=2–15, and z=0–7, into the reaction space when the source gas is introduced.

19. The method according to claim 1, further comprising introducing as an additive gas a gas of CxHyOz which is selected from the group consisting of $H_2$, $C_{1-6}$ saturated or unsaturated hydrocarbon, $C_{1-6}$ alkanol, and $C_{3-20}$ ether into the reaction space when the source gas is introduced.

20. The method according to claim 1, wherein the low-frequency RF power is 1%–50% of the high-frequency RF power.

21. The method according to claim 1, wherein the low-frequency RF power has a frequency of 2 MHz or less.

22. A method for forming a hard film on an insulation film formed on a semiconductor substrate by plasma reaction, comprising the steps of:
    forming an insulation film on a semiconductor substrate placed in a reaction space by plasma polymerization using a silicon-containing hydrocarbon compound;
    vaporizing a silicon-containing hydrocarbon compound to provide a source gas, said silicon-containing hydrocarbon compound comprising a cyclic Si-containing hydrocarbon compound and/or a linear Si-containing hydrocarbon compound, as a basal structure, with reactive groups for forming oligomers using the basal structure;
    introducing a reaction gas comprising the source gas and a carrier gas into the reaction space; and
    forming a hard film on the insulation film by activating plasma polymerization reaction using a combination of low-frequency RF power and high-frequency RF power in the reaction space, wherein the plasma polymerization reaction is activated while controlling the flow of the reaction gas to lengthen a residence time, Rt, of the reaction gas in the reaction space, wherein 100 msec$\leq$Rt, $$Rt[s]=9.42\times10^7(Pr\cdot Ts/Ps\cdot Tr)r_w^2 d/F$$

wherein:
Pr: reaction space pressure (Pa)
Ps: standard atmospheric pressure (Pa)
Tr: average temperature of the reaction (K)
Ts: standard temperature (K)
$r_w$: radius of the silicon substrate (m)
d: space between the silicon substrate and the upper electrode (m)
F: total flow volume of the reaction gas (sccm).

23. The method according to claim 22, wherein the silicon-containing hydrocarbon used for forming the hard film and the silicon-containing hydrocarbon used for forming the insulation film have the same chemical formula.

24. The method according to claim 22, wherein the formation of the insulation film and the formation of the hard film are conducted continuously in the reaction space.

25. A method for forming a hard film on an insulation film formed on a semiconductor substrate by plasma reaction, comprising the steps of:
    vaporizing a silicon-containing hydrocarbon compound to provide a source gas, said silicon-containing hydrocarbon compound comprising a cyclic Si-containing hydrocarbon compound and/or a linear Si-containing hydrocarbon compound, as a basal structure, with reactive groups for forming oligomers using the basal structure;
    introducing a reaction gas comprising the source gas and an additive gas into a reaction space for plasma CVD processing wherein a semiconductor substrate on which an insulation film is formed is placed, said additive gas being selected from the group consisting of $C_{1-6}$ saturated or unsaturated hydrocarbon, $C_{1-6}$ alkanol, and $C_{3-20}$ ether; and
    forming a hard film on the insulation film by activating plasma polymerization reaction using radio-frequency RF power in the reaction space, wherein the plasma polymerization reaction is activated while controlling the flow of the reaction gas to lengthen a residence time, Rt, of the reaction gas in the reaction space, wherein 100 msec $\leq$Rt, $$Rt[s]=9.42\times10^7(Pr\cdot Ts/Ps\cdot Tr)r_w^2 d/F$$

wherein:
Pr: reaction space pressure (Pa)
Ps: standard atmospheric pressure (Pa)
Tr: average temperature of the reaction (K)
Ts: standard temperature (K)
$r_w$: radius of the silicon substrate (m)
d: space between the silicon substrate and the upper electrode (m)
F: total flow volume of the reaction gas (sccm).

26. The method according to claim 25, wherein the reaction gas further comprises a carrier gas.

27. The method according to claim 25, wherein the radio-frequency RF power is comprised of 1%–50% of low-frequency RF power and 50%–99% of high-frequency RF power.

28. A method for forming a hard film on an insulation film formed on a semiconductor substrate by plasma reaction, comprising the steps of:
    vaporizing a silicon-containing hydrocarbon compound to provide a source gas, said silicon-containing hydrocarbon compound comprising a cyclic Si-containing hydrocarbon compound and/or a linear Si-containing hydrocarbon compound, as a basal structure, with reactive groups for forming oligomers using the basal structure;
    introducing a reaction gas comprising the source gas into a reaction space for plasma CVD processing wherein a semiconductor substrate on which an insulation film is formed is placed; and
    forming a hard film on the insulation film by activating plasma polymerization reaction using radio-frequency RF power in the reaction space, wherein the plasma polymerization reaction is activated while controlling the flow of the reaction gas to lengthen a residence time, Rt, of the reaction gas in the reaction space, wherein 100 msec $\leq$Rt, $$Rt[s]=9.42\times10^7(Pr\cdot Ts/Ps\cdot Tr)r_w^2 d/F$$

wherein:
Pr: reaction space pressure (Pa)
Ps: standard atmospheric pressure (Pa)
Tr: average temperature of the reaction (K)
Ts: standard temperature (K)
$r_w$: radius of the silicon substrate (m)
d: space between the silicon substrate and the upper electrode (m)
F: total flow volume of the reaction gas (sccm).

29. The method according to claim 27, wherein the reaction gas further comprises the gas of CxHyOz which is selected from the group consisting of $C_{1-6}$ saturated or unsaturated hydrocarbon, $C_{1-6}$ alkanol, and $C_{3-20}$ ether.

30. The method according to claim 27, wherein the reaction gas further comprises a carrier gas.

31. The method according to claim 27, wherein the radio-frequency RF power is comprised of 1%–50% of low-frequency RF power and 50%–99% of high-frequency RF power.

* * * * *